United States Patent [19]

Saito et al.

[11] Patent Number: 4,610,770
[45] Date of Patent: Sep. 9, 1986

[54] METHOD AND APPARATUS FOR SPUTTERING

[75] Inventors: Hiroshi Saito; Hideki Tateishi, both of Yokohama; Shigeru Kobayashi, Tokyo; Susumu Aiuchi; Yasumichi Suzuki, both of Yokohama; Masao Sakata; Hideaki Shimamura, both of Yokohama; Tsuneaki Kamei, Kanagawa, all of Japan

[73] Assignee: Hitachi, Ltd., Tokyo, Japan

[21] Appl. No.: 686,005

[22] Filed: Dec. 24, 1984

[30] Foreign Application Priority Data

Dec. 26, 1983 [JP] Japan .................. 58-243870

[51] Int. Cl.[4] .................................. C23C 15/00
[52] U.S. Cl. .......................... 204/192.1; 204/298
[58] Field of Search .................. 204/192 R, 298

[56] References Cited

U.S. PATENT DOCUMENTS

| | | | |
|---|---|---|---|
| 4,265,730 | 5/1981 | Hirose | 204/298 |
| 4,298,419 | 11/1981 | Suzuki | 204/298 |
| 4,339,326 | 7/1982 | Hirose | 204/298 |
| 4,512,868 | 4/1985 | Fujimura | 204/192 R |

Primary Examiner—T. M. Tufariello
Attorney, Agent, or Firm—Antonelli, Terry & Wands

[57] ABSTRACT

A pair of magnets for producing a mirror magnetic field are disposed outside of an electrode structure carrying a target. Microwaves from a microwave source are introduced toward and into a space defined by the mirror magnetic field for generating high-density plasma. While maintaining this high-density plasma over a wide area of the surface of the target, an electric field substantially perpendicular to the surface of the target is applied for sputtering of the target material. The optimized conditions for plasma generation can be selected when the high-density plasma formed outside of a processing chamber is guided to migrate toward an area above the target in the processing chamber. Capability of sputtering of the material from the entire surface of the target increases the rate of film deposition on a substrate and improves the target utilization rate (the quantity of the material deposited on the substrate/the usable area of the target).

24 Claims, 8 Drawing Figures

METHOD AND APPARATUS FOR SPUTTERING

This invention relates to sputtering, and more particularly to the so-called plasma sputtering according to which cations existing in plasma are accelerated by an electric field to impinge against the surface of a target thereby depositing the material of the target on the surface of a substrate or a workpiece.

Sputtering is one of important techniques used for film deposition, e.g. in the course of manufacture of semiconductor devices. The process of sputtering includes generally ionizing an inert gas (for example, argon) to generate cations and accelerating the cations to impinge against the surface of a target, thereby causing emission of constituent atoms or molecules from the target and depositing the liberated atoms or molecules on the surface of a substrate disposed opposite to the target. The deposition rate or speed is dependent upon the number of ions incident on the surface of the target and the sputtering yield of the ions. It is effective to utilize plasma at a high density for increasing the number of incident ions.

Planar magnetron sputtering is known in which a target is disposed on or above a cathode, and a central magnetic pole member and a peripheral magnetic pole member are disposed in the cathode disposed underneath the target. There is formed a closed loop of magnetic field in the electrode structure. Due to the above arrangement, arcuate lines of magnetic force extending through the target in the thicknesswise direction thereof appear between the central magnetic pole member and the peripheral magnetic pole member. These magnetic lines of force flow in the radial direction when viewed from the upside of the target. The central portion of the magnetic lines of force forms an upward convex arc on the surface of the target. In other words, the profile of the magnetic lines of force on the target is analogous to that of a doughnut truncated in its lower portion. Plasma is produced when the electric field is built up by the electrode structure in the presence of a low-pressure gas introduced into such a magnetic field, and electrons tending to migrate outward from the doughnut-like portion are deflected by the magnetic field to be confined within the extent of the magnetic field distribution. These electrons contribute to further ionization of the gas molecules. Thus, high-density plasma in the form of a doughnut (toroidal ring) or a hollow circle (loop) is produced on the target. Cations (inert gas ions) in the plasma are accelerated toward the target by the electric field to effect sputtering. As a result, the corresponding area of the target is eroded in the form of a hollow ring or loop.

According to this method, the target is eroded in its local area only. Therefore, the ratio of the sputtering-participating area to the entire area of the surface of the target (the target utilization efficiency) is low, the deposition rate is low, and the useful service life of the target is short.

A proposal for changing the diameter of the magnetic flux distribution thereby widening the eroded surface area of the target has been made, as disclosed, for example, in U.S. Pat. No. 4,401,539 assigned to the present assignee. According to the proposal, however, only a limited portion of the surface area of the target is utilized for sputtering at a moment. It has therefore been strongly demanded to develop a method and apparatus which can more effectively utilize the target so that the entire surface area of the target can serve as a source of vaporization or sputtering.

It is a primary object of the present invention to provide a sputtering method and apparatus which can utilize a possible wide surface area of a target for attaining sputtering without locally eroding the target in the pattern of a hollow ring or loop.

For the purpose of attaining sputtering with the material vaporized from a widest possible area of a target without causing local erosion of the target, employment of magnets such as those employed in the prior art planar magnetron sputtering is not desirable. On the other hand, however, it is difficult to increase the density of plasma without the aid of a magnetic field. In the case of the prior art planar magnetron sputtering which utilizes magnetic lines of force emanating through a target, drawing an arc above the target and terminating to flow through the target again, high-density plasma has been produced only on a portion of the target (corresponding to the bulged portion of the arc of the magnetic lines of force on the target). In contrast, the inventors contemplate to generate a magnetic field of such a configuration which does not substantially include magnetic lines of force traversing a target and forming closed loops in an electrode structure, so that high-density plasma can be produced in the magnetic field of the above configuration for the purpose of effecting efficient sputtering. According to an aspect of the present invention, the combination of a mirror magnetic field and a source of microwave is used to produce high-density plasma thereby efficiently sputtering the material of a target on the surface of a substrate. The mirror magnetic field can be produced by a pair of magnets. When such two magnets are arranged on a single axis in coaxial relation, a magnetic flux distribution is obtained in which the lines of magnetic flux expand or bulge in the region intermediate between the magnets and are constricted in the regions close to the magnets. By utilizing such mirror magnetic flux and directing microwaves toward the intermediate expanding flux region, high-density plasma can be produced to be confined in the expanding flux region. Further, the density of the plasma can be made very high, unlike the case where such a mirror magnetic field is not present. In an aspect, the high-density plasma produced at a place remote from the target is guided toward the target to be maintained in an area above the target. In another aspect, the high-density plasma is directly produced and maintained in an area above the target.

According to the present invention, the high-density plasma can thus be maintained above the target over a wide surface area of the target. Also, by virtue of the fact that the energy of ions impinging against the target can be controlled independently of the emission of the plasma, the optimized sputtering conditions can be selected as desired to meet the material of the target. The capability of attaining desired sputtering of material over the wide surface area of the target can greatly increase the rate of film deposition by sputtering and can also greatly improve the rate of utilization of the target. Also, the capability of selecting the optimized sputtering conditions meeting the material of the target improves the efficiency of production and also improves the rate of utilization of material as well as the performance of semiconductor devices.

Other objects, features and advantages of the present invention will become apparent from the following detailed description of preferred embodiments thereof taken in conjunction with the accompanying drawings, in which:

For a better understanding of the present invention, the prior art will be first described before describing the present invention in detail.

Figure 1A:
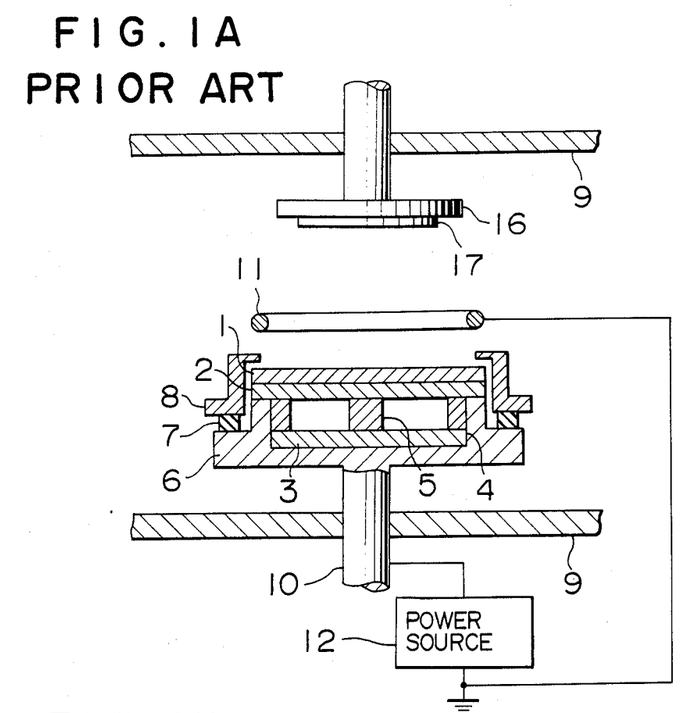
FIG. 1A is a schematic sectional view of a prior art, planar magnetron sputtering apparatus.
Figure 1B:
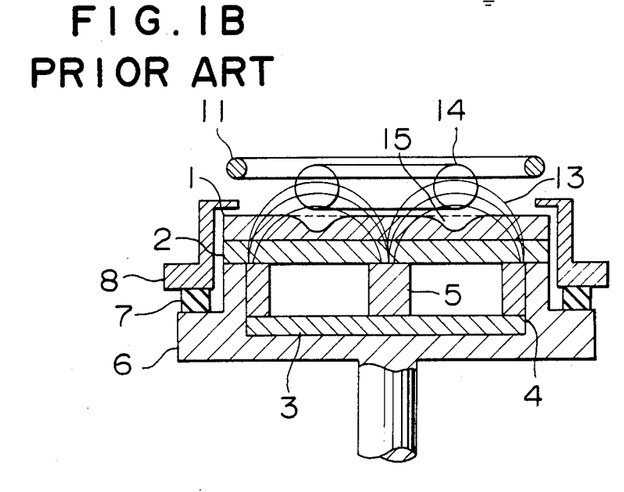
FIG. 1B is an enlarged partial view of the electrode structure in FIG. 1A to show how a target plate is eroded.

FIGS. 1A and 1B show schematically the structure of a prior art, planar magnetron sputtering apparatus.

Referring to FIGS. 1A and 1B, a target plate (referred to hereinafter merely as a target) 1 is backed up at its rear surface by a backing plate 2. Disposed on the rear surface side of the backing plate 2 are a peripheral annular magnetic pole member 4 and a central solid cylindrical magnetic pole member 5 which are magnetically coupled to each other by a yoke 3 to constitute a magnetic circuit. The target 1 and the backing plate 2 are made of non-magnetic materials respectively, and the lines of magnetic flux flowing between the magnetic members draw an arc extending through the target 1 in the thicknesswise direction of the target 1 as shown in FIG. 1B. A cathode 6 encloses the magnetic members 4, 5 and yoke 3 therein and is hermetically closed by the backing plate 2. A shield 8 is mounted on the outer peripheral portion of the cathode 6 with an annular insulating member 7 interposed therebetween. The cathode 6 is supported on a shaft 10 which is electrically insulated from and hermetically secured to a hermetic or vacuum enclosure wall 9 of a vacuum chamber. An anode 11 is disposed above the cathode 6, and a power source 12 is connected between the anode 11 and the cathode 6.

In the prior art sputtering apparatus having the structure described above, the lines of magnetic force in the vicinity of the surface of the target 1 are distributed to provide a doughnut-like or semi-annular magnetic field distribution 13 as best seen in FIG. 1B. Application of the power supply voltage across the anode 11 and the cathode 6 generates plasma. The semi-annular magnetic field distribution 13 acts to confine the plasma so that the plasma has a high density in a toroidal ring region 14 shown in FIG. 1B. The ions in the plasma are accelerated by an electric field substantially perpendicular to the surface of the target 1 to impinge against the surface of the target 1. As a result, some or more of the constituent atoms or particles are sputtered out from the surface of the target 1 to leave a locally eroded or etched region 15 on the target surface. The atoms or particles sputtered out from the surface of the target 1 migrate toward and onto the lower surface of a substrate 17 supported on a substrate stage 16 to deposit and form a thin film on the lower surface of the substrate 17.

The eroded or etched region 15 on the surface of the target 1 is progressively widened with time due to repetition of the sputtering process. However, this erosion is generally limited to a specific region on the surface of the target 1 in the target arrangement shown in FIG. 1B.

It will be seen from the above description that, in the prior art sputtering apparatus of the planar magnetion type, the plasma has a high density above a limited region only of the surface of the target 1, and progressive erosion of the target 1 due to repeated sputtering is limited to a specific region only of the target 1. Because of the limited small area of the source of sputtering, the rate of deposition of the target material on the substrate 17 cannot be increased, and the rate of utilization of the target surface is also low. Also, due to the progressive erosion of a limited region only of the target 1 with time due to repetition of the sputtering process, it has been necessary to replace the target 1 when the specific region has been eroded by a predetermined quantity or limit, resulting in a short usable life of the target.

The present invention eliminates the use of the magnets disposed beneath the target in the electrode structure of the prior art magnetron sputtering apparatus and yet attains the formation of high-density plasma over a wide area of the surface of the target. More precisely, according to the present invention, high-density plasma covering a substantial area of the surface of the target is generated without resorting to the use of a magnetic field forming a closed loop of magnetic flux extending through the target in the thicknesswise direction of the target.

Plasma having a high density is generated with the use of a magnetic field not forming a closed loop inside the electrode structure which contains the target, unlike the prior art, and the plasma is maintained above the target to cover a wide area of the surface of the target for effecting desired sputtering. According to one aspect of the present invention, magnets for establishing a mirror magnetic field are disposed at a place remote from a target, and microwaves are introduced toward and into the space defined by the lines of magnetic force of the mirror magnetic field thereby generating plasma having a high density.

The space defined by the magnetic lines of force of the mirror magnetic field (the intermediate bulged portion of the magnetic flux) exhibits a confinement effect on the plasma.

The electrode structure in the present invention includes an anode and a cathode (a power source is to be connected therebetween), and a target is supported on the cathode. Therefore, an electric field substantially perpendicular to the surface of the target is produced. Cations existing above the target are accelerated by the electric field to impinge against the target.

The absence of any magnetic lines of force forming a closed loop in the electrode structure which contains the target is equivalent to or indicates the absence of a magnetic flux distribution drawing an arc above the target and having a bulged portion extending adjacent to a limited region only of the target. Therefore, a limited region only of the target is not eroded unlike that employed in the prior art sputtering apparatus of the planar magnetron type. The high-density plasma is generated by the aid of the mirror magnetic field, but the plasma is not localized to a limited region only of the target.

The high-density plasma is maintained in an area above the target according to, for example, one of the following manners: (1) The high-density plasma is generated at a place distant from the target by the combination of a mirror magnetic field and microwaves, and the thus generated high-density plasma is guided to migrate toward an area above the target. (2) Plasma migrated according to the method (1) is confined in a magnetic field whose lines of force do not penetrate the target and are in parallel to the surface of the target. (3) A mirror magnetic field is established in an area close to the target in such a relation that the lines of force or magnetic flux penetrate the entire surface of the target, and microwaves are directed toward and into the space defined by the mirror magnetic field.

Figure 2:
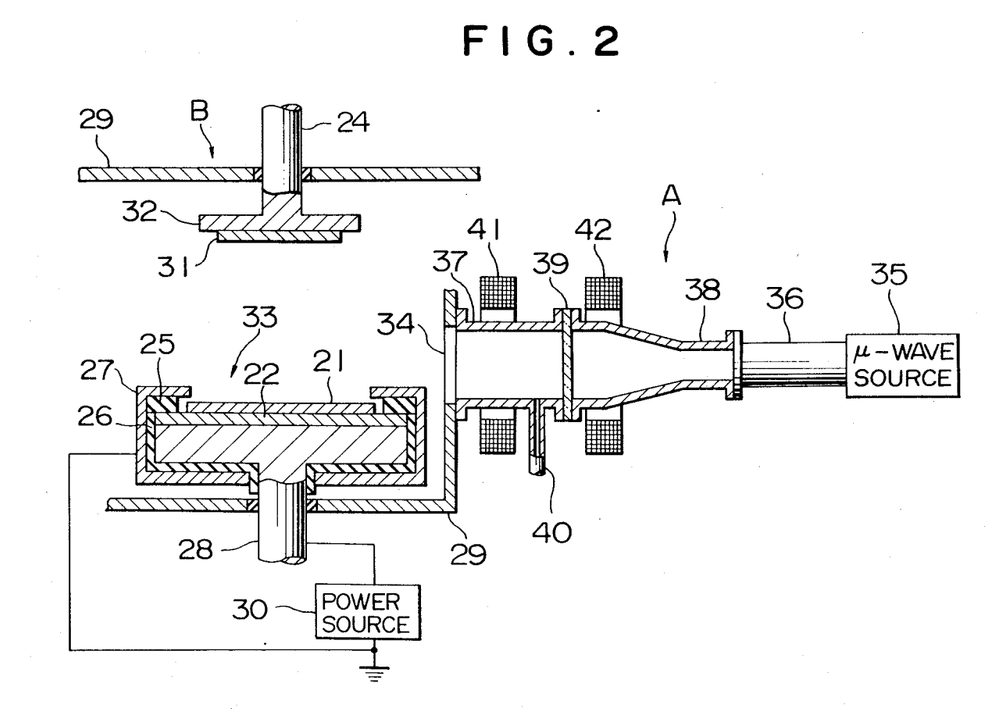
FIG. 2 is a diagrammatic sectional view of an embodiment of the sputtering apparatus according to the present invention.
Figure 3:
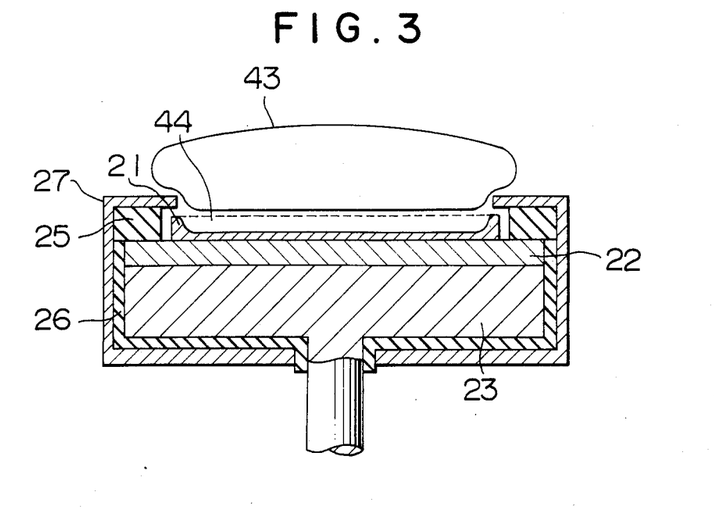
FIG. 3 is a sectional view showing schematically the profile of plasma generated on the target shown in FIG. 2.

FIGS. 2 and 3 show an embodiment of the present invention in which plasma having a high density is generated in a plasma generating section and is then guided to migrate toward an area above a target disposed in a processing chamber.

Referring to FIG. 2, a plasma generating section A includes a pair of magnets 41, 42 for establishing a mirror magnetic field and a source 35 of microwaves. In a plasma generating chamber 37, the mirror magnetic field is established by the magnets 41 and 42, and microwaves from the microwave source 35 are directed toward and into the chamber 37 in a relation coaxial with the mirror magnetic field.

The microwave source 35 supplies the microwaves through a waveguide 36. Herein, the term "microwaves" is used to designate electromagnetic waves having a wavelength less than about 100 cm. Generally, electromagnetic waves having a wavelength of from about 1 cm to about 100 cm are called the microwaves. As a typical example of commercially available sources, a microwave source of 2.45 GHz (corresponding to a wavelength of about 12 cm) is well known. The plasma generating chamber 37 is a waveguide in itself and hermetically communicates with a processing section B through an opening 34 to form a hermetic structure. The plasma generating chamber 37 is connected to the waveguide 36 for the microwave source 35 through a hermetically sealed microwave window 39 formed of a material such as quartz or alumina and through a tapered waveguide 38 tapered for the purpose of diameter matching. The plasma generating chamber 37 is provided with a gas inlet 40 through which a plasma-forming gas, for example, an inert gas such as Ar, Xe, He or Rn can be introduced. Preferably, Ar or Xe is used.

A processing chamber (described later) enclosed by a hermetic or vacuum enclosure wall 29 can be evacuated together with the plasma generating chamber 37 by an evacuating system including, for example, a cryopanel maintained at the temperature of liquid He and aided by a rotary pump, or a turbo-molecular pump. The vacuum is desirably oil-less and clean. After the step of evacuation, a working gas such as Ar at a pressure of the order of $10^{-4}$ to $10^{-2}$ Torr ($10^{-2}$ to $10^0$ Pa) is introduced into the plasma generating chamber 37 from the gas inlet 40, and the microwaves from the microwave source 35 are directed to the working gas to generate plasma in the chamber 37. When the microwave source 35 is a 2.45 GHz source, the upper limit of the density of the plasma is usually $7.4 \times 10^{10}$ electrons/c.c. without the aid of a magnetic field. It is to be noted that the above limit is exceeded by the utilization of a magnetic field, and plasma having a high density can be generated. Thus, when a mirror magnetic field having a strength exceeding that required for satisfying the condition of electron cyclotron resonance (ECR) is established in parallel to the direction of the microwaves, the cut-off condition disappears, and plasma having a density as high as $10^{11}$ to $10^{12}$ electrons/c.c. can be generated.

The pair of electromagnets 41 and 42 are provided for establishing such a mirror magnetic field, and the magnet 42 has a field strength higher than that of the magnet 41. Therefore, rightward migration of the plasma in FIG. 2 is restricted, and the plasma migrates in the direction of from the magnet 42 toward the magnet 41 (leftward in FIG. 2).

The processing section B includes an evacuatable processing chamber enclosed by the wall 29, and, in this evacuatable processing chamber, a substrate 31 to be deposited with a thin film is disposed opposite to a target 21 made of a film-forming material and contained in an electrode structure 33.

The substrate 31 is held in position by a substrate holder 32, and the holder 32 is supported by a supporting shaft 24. Both of the holder 32 and the shaft 24 are made of a metal material. The shaft 24 is hermetically fixed in position in a relation electrically insulated from the chamber wall 29. The electrode structure 33 is supported on a feedthrough post 28 which is hermetically fixed in position in a relation electrically insulated from the chamber wall 29. The substrate 31 may be disposed in any suitable position relative to the target 21, provided that the material sputtered out from the target 21 can be successfully deposited in thin film form on the surface of the substrate 31. Preferably, both of the target 21 and the substrate 31 extend vertically and are disposed opposite to each other as shown.

The electrode structure 33 does not include magnets unlike that in the prior art sputtering apparatus of the planar magnetron type. A cathode 23 is disposed beneath the target 21 with a backing plate 22 made of a good electrical and thermal conductor such as copper interposed therebetween, and an anode 27 is disposed around the stack of the target 21, backing plate 22 and cathode 23 with insulator members 25 and 26 interposed therebetween, so that cations can be directed perpendicularly toward and onto the surface of the target 21. Both of the anode 27 and the cathode 23 may be formed of a metal such as a stainless steel or aluminum.

The target 21 is formed of a material to be deposited on the surface of the substrate 31. Typical examples of the material of the target 21 are a metal such as Al, W or Mo, a semiconductor such as Si, and an electrical insulator such as $SiO_2$. In FIG. 2, a power source 30, e.g. a DC power source, is shown connected between the anode 27 and the cathode 23 for establishing a cation-accelerating electric field above the target 21. When the target is formed of an insulator such as $SiO_2$, an rf source is connected between the anode 27 and the cathode 23.

When the central axis of the plasma generating chamber 37 (or the central axis of the magnetic field or of the microwaves) is parallel to the target surface, it is preferable that the upper end of the opening 34 lies beneath the substrate 31, and its center lies above the target 21. This is because, when a portion of the opening 34 lies above the substrate 31, trouble such as etching of the substrate 31 and the film deposited thereon tends to occur, while, when the center of the opening 34 lies beneath the target 21, the highest density portion of the plasma can be hardly effectively utilized.

On the other hand, when the central axis of the plasma generating chamber 37 makes an angle with the surface of the target 21, it is preferable that an extension of the central axis of the chamber 37 intersects with the middle portion of the surface of the target 21.

Although the DC power source 30 is described as an example of the cation-accelerating power source, it may be replaced by an rf power source. Especially, when the material of the target 21 is an electrical insulator, the rf power source is effective for preventing charge-up of the target 21. Other charge-up preventive means or charge neutralizing means may be combined with the power source when so desired.

The process of deposition of a film on the substrate 31 by sputtering includes introducing, for example, Ar gas into the plasma generating chamber 37 (and the processing chamber 29) until a predetermined pressure builds up, energizing the electromagnets 41, 42 and directing the microwaves from the microwave source 35 toward and into the plasma generating chamber 37. Consequently, plasma having a high density ($10^{11}$ to $10^{12}$ electrons/c.c.) is generated in the space defined principally by the mirror magnetic field in the plasma generating chamber 37. Since the strength of the right-hand portion of the mirror magnetic field is larger than that of the left-hand portion in FIG. 2, the substantial portion of the plasma diffuses leftward to migrate into the processing chamber 29. The plasma migrated into the processing chamber 29 diffuses over a wide area of the surface of the target 21 to cause sputtering of the material of the target 21 under influence of the electric field established in a relation substantially perpendicular to the surface of the target 21. Atoms, molecules, etc. sputtered out from the surface of the target 21 fly upward to be deposited on the surface of the substrate 31.

FIG. 4 shows schematically the profile of the plasma 43 maintained above the target 21. This plasma 43 is generated in the plasma generating chamber 37 and guided to migrate toward the area above the target 21. In the present invention, the magnets disposed beneath the target in the prior art apparatus are removed, and plasma formed at a separate place is guided to migrate toward the area above the target 21. Therefore, the high-density plasma can be distributed over a wide area above the surface of the target 21, and no hollow portion occurs in the plasma unlike the prior art, planar magnetron sputtering. According to the first embodiment of the present invention, the wide area (preferably, the entire area) of the surface of the target 21 can participate in the sputtering operation. Therefore, the quantity of atoms or particles sputtered out from the surface of the target 21 per unit time increases, and the rate of deposition of the atoms or particles on the surface of the substrate 31 also increases. Further, almost the entirety of the surface area of the target 21 is eroded to greatly increase the rate of the usable area of the target 21, and this increases the number of wafers that can be processed with a single target.

Further, according to the embodiment of the present invention, the density of high-density plasma can be controlled by controlling the microwave source 35, and the power supply voltage applied across the anode 27 and the cathode 23 provides the ion-accelerating energy. Thus, the density of the plasma and the acceleration of the ions can be controlled independently, so that the optimized sputtering conditions meeting the material of the target can be selected as desired.

In the embodiment of the present invention, there is not any substantial confining effect on the plasma guided to migrate to the area above the target. Although the perpendicular electric field on the target acts to accelerate the cations toward and onto the target, its confining effect on the electrons is not marked.

Figure 4A:
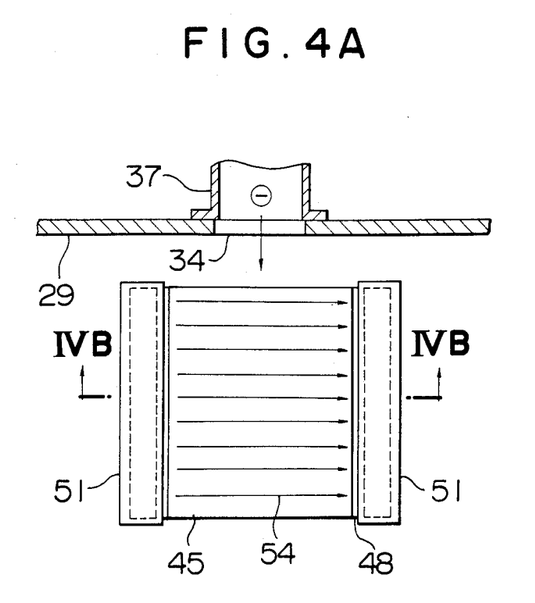
FIG. 4A is a schematic top plan view of part of another embodiment of the sputtering apparatus according to the present invention.
Figure 4B:
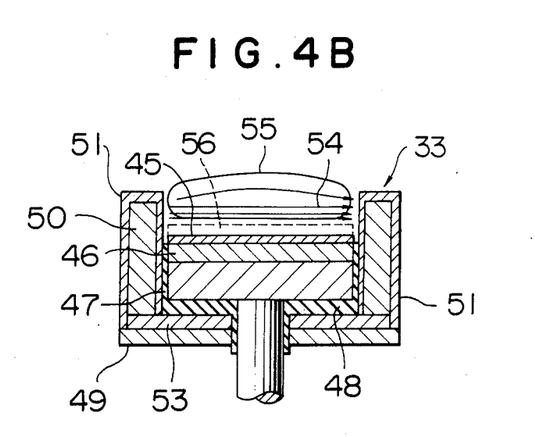
FIG. 4B is a schematic sectional view taken along the line IVB—IVB in FIG. 4A.

FIGS. 4A and 4B shows part of another embodiment of the present invention which comprises an electrode structure exhibiting a marked confining effect on electrons in plasma guided to migrate toward the area above a target. In this second embodiment, the Lorentz's force produced by a magnetic field is imparted to electrons migrating toward a target from a plasma generating chamber to impart rotary motion to the electrons for trapping the electrons in the vicinity of the surface of the target. For this purpose, a magnetic field substantially parallel to the surface of the target is established. The structure of this second embodiment is generally similar to that of the first embodiment shown in and described with reference to FIG. 2, except its electrode structure.

Referring to FIG. 4B, a cathode 47, a backing plate 46 and a target plate 45 are stacked in tiers to constitute a cathode structure, as in the case of FIG. 2. It will be seen in FIG. 4A that this cathode structure is rectangular in shape. This rectangular shape is advantageous over a circular shape in that a uniform magnetic field parallel to the surface of a target can more easily be produced.

An insulator member 48 surrounds the cathode structure, and an anode structure 52 surrounds the insulator member 48. The anode structure 52 includes an anode base 49 and magnetic members 50, 51 disposed on the bath end edge portions respectively of the anode base 49. A yoke 53 magnetically coupling the magnetic members 50 and 51 is disposed between the anode base 49 and the insulator member 48. The yoke 53 and the magnetic members 50, 51 are magnetically coupled to constitute a magnetic circuit which is open at its upper part. By the function of this magnetic circuit, a magnetic flux distribution 54 substantially parallel to the surface of a target 45 is provided above the target 45.

Referring to FIG. 4A, electrons migrating from the plasma generating chamber 37 cross the magnetic field 54. The electrons are subjected to rotary motion by the Lorentz's force. As a result, the electrons imparted with the rotary motion are trapped in an area in the vicinity of the target 45. The trapped electrons impinge against neutral molecules/atoms to further promote ionization thereby maintaining the plasma at the high density. Thus, the high-density plasma 55 (FIG. 4B) is maintained above the surface of the target 45. The cations in the high-density plasma 55 are accelerated by an electric field substantially perpendicular to the surface of the target 45 to impinge against the surface of the target 45 thereby causing sputtering of atoms or particles from the surface of the target 45. These atoms or molecules deposit on the surface of a substrate (not shown) to form a thin film thereon.

As shown at 56 in FIG. 4B, the target 45 is eroded over a widely extended region in the second embodiment of the present invention until finally the target 45 can be eroded over its entire surface region. Also, according to the second embodiment, the plasma maintained above the target 45 has a density higher than that in the first embodiment shown in FIG. 2, by virtue of the plasma confining effect of the magnetic field. Therefore, the film deposition by sputtering can be attained at a higher rate. Further, due to the fact that the plasma can be confiend in the area adjacent to the target 45, close access of the plasma to the substrate can be prevented, thereby reducing the possibility of impingement of charged particles against the substrate and minimizing damage to the substrate.

Figure 5:
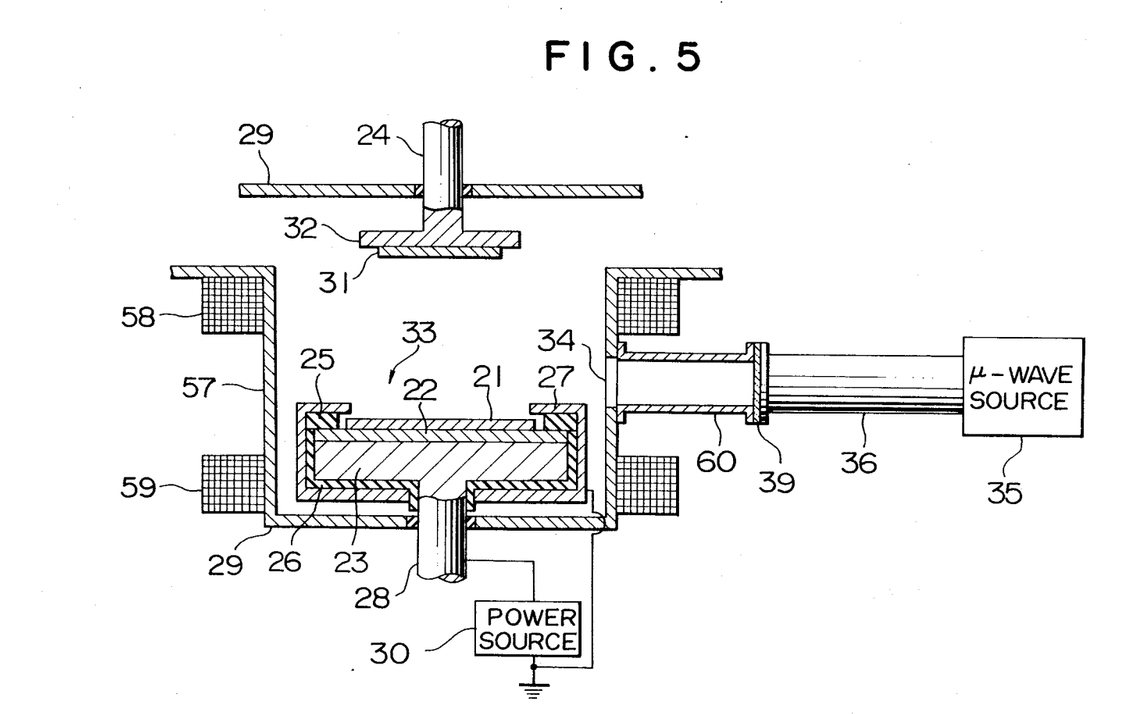
FIG. 5 is a diagrammatic sectional view of still another embodiment of the sputtering apparatus according to the present invention.
Figure 6:
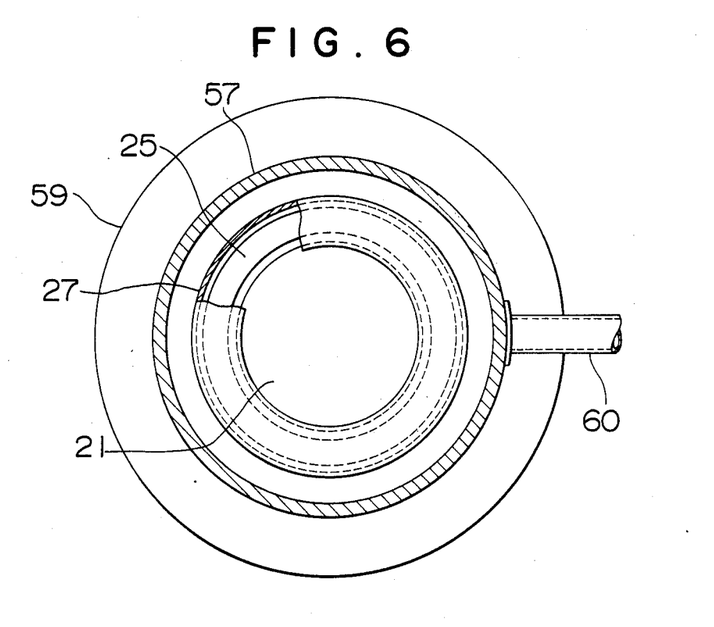
FIG. 6 is a top plan view of part of the apparatus shown in FIG. 5.

FIGS. 5 and 6 show still another embodiment of the present invention in which a mirror magnetic field is formed directly above a target, and microwaves are directed toward plasma for attaining sputtering by erosion of a widest possible area of the surface of the target. In this third embodiment, its electrode structure and substrate supporting structure are similar to those employed in the embodiment shown in FIG. 2.

Referring to FIGS. 5 and 6, a target 21 is backed up at its rear surface by a backing plate 22, and a cathode 23 is disposed to make intimate engagement at its front surface with the rear surface of the backing plate 22. An anode 27 is disposed outside of the cathode 23 with a disc-shaped insulator member 25 and a cylindrical insulator member 26 interposed therebetween.

A feedthrough post 28 of the cathode 23 extends through a vacuum enclosure wall 29 to support the anode 27 and cathode 23 in an evacuatable processing chamber in a relation electrically insulated from the wall 29. A power source 30 is connected between the anode 27 and the cathode 23.

A substrate 31 is disposed on a substrate holder 32 at a position opposite to the target 21. A shaft 24 of the substrate holder 32 extends through the vacuum enclosure wall 29 to support the substrate 31 in the evacuatable processing chamber in a relation electrically insulated from the wall 29. An opening 34 is provided in a portion of a vacuum enclosure wall 57 surrounding the electrode structure 33, and a waveguide 60 for microwaves is connected at one end thereof to the opening 34. Another waveguide 36 is connected at one end thereof to the other end of the waveguide 60 through a hermetic window 39 permeable to microwaves and at the other end thereof to a microwave source 35. The waveguides 36 and 60 are so disposed as to direct microwaves toward an area above the surface of the target 21. The window 39 is disposed at a position retracted or spaced apart from the wall 29 of the processing chamber so that the sputtered material may not deposit on the window 39 thereby obstruct introduction of the microwaves. The microwave introduction mechanism may be any other suitable one, provided that microwaves can be effectively directed toward the area above the target 21, and deposition of the sputtered material on the window 39 can be prevented. Although only one microwave introduction mechanism is illustrated, a plurality of such mechanisms may be disposed in radial relation. Typically, the axis of the microwave introduction system is arranged to be horizontal, and the lower end of the waveguide 60 aligns substantially with the upper end of the electrode structure 33, as illustrated.

In the absence of any magnetic field, the upper limit of the density of the plasma is $7.4 \times 10^{10}$ electrons/c.c. at the most. In the absence of the magnetic field, plasma will diffuse, and it will be unable to increase the density of the plasma in the area above the target. Therefore, a magnetic field having a strength exceeding that required for satisfying the condition of ECR is produced above the target 21. In order to form the plasma over a wide range including the entire surface area of the target 21, it is preferable to dispose magnets outside of the electrode structure 33, preferably, outside of the cylindrical wall 29 of the processing chamber, thereby producing a mirror magnetic field which is coaxial with the normal extending through the center of the target 21. The target 21 and the vacuum enclosure wall 57 are preferably circular in sectional shape for producing such a magnetic flux distribution.

Referring to FIG. 5, annular magnets 58 and 59 are disposed outside the vacuum enclosure wall 57 at position upper and lower relative to the waveguide 60. These magnets 58 and 59 establish a mirror magnetic field so that charged particles (especially, electrons having high energy) in the plasma generated in the vicinity of the electrode structure 33 can be confined in an area near the surface of the target 21 and may not impinge against the substrate 31.

The working gas may be introduced from any desired position provided that it can be quickly supplied toward and onto the target 21. For the purpose of excitation of the plasma, it is most effective to introduce the microwaves in a relation coaxial with the axis of the magnetic field. However, in the case of the third embodiment in which the mirror magnetic field is produced in coaxial relation with the central axes of the target 21 and substrate 31 disposed opposite to each other, it is almost impossible to direct the microwaves in coaxial relation with the mirror magnetic field. In this case, therefore, the microwaves are preferably introduced along the surface of the target 21 as shown in FIG. 5.

In operation, the power supply voltage from the power source 30 is applied across the anode 27 and the cathode 23, and the microwaves from the microwave source 35 are introduced to generate the plasma in the area above the target 21. Electrons in the plasma are excited by the microwaves in the mirror magnetic field established by the magnets 58 and 59, thereby making cyclotron motion. Consequently, impingement between the electrons and the neutral particles is promoted to increase the density of the plasma.

In this manner, plasma having a high density is formed above the surface of the target 21. By controlling the factor, for example, the profile of the mirror magnetic field, plasma having a controlled high density covering the entire area of the surface of the target 21 can be generated as in the case of FIG. 3. The ions in the plasma are accelerated to migrate toward and onto the surface of the target 21 under influence of the electric field substantially perpendicular to the target surface until the ions impinge against the surface of the target 21. As a result, constituent atoms or particles are sputtered out from the surface of the target 21, and the thus sputtered-out atoms or particles deposit to form a thin film on the surface of the substrate 31.

The plasma formed in the area above the surface of the target 21 has a high density over the entire area of the surface of the target 21. Therefore, almost the entirety of the surface of the target 21 can be eroded as a result of sputtering.

According to the third embodiment of the present invention, plasma having a high density can be generated in the area above the entire surface of the target 21, and almost the entirety of the surface of the target 21 can participate in the sputtering operation. Therefore, the quantity of atoms or particles sputtered out from the surface of the target 21 per unit time increases, and the rate of deposition of the atoms or particles on the surface of the substrate 31 also increases. Further, almost the entirety of the surface area of the target 21 is eroded to greatly increase the rate of the usable area of the target 21, and this increases the number of wafers that can be processed with a single target.

Also, according to the third embodiment of the present invention, the density of high-density plasma can be controlled by controlling the microwave source, and the power supply voltage applied across the anode 27 and the cathode 23 provides the ion-accelerating electric field. Thus, the density of the plasma and the acceleration of the ions can be controlled independently, so that the optimized sputtering conditions meeting the material of the target can be selected as desired.

We claim:

1. In a method for sputtering including disposing an electrode structure carrying a planar target opposite to a substrate and causing sputtering of the target material from said target by the action of plasma for deposition of a thin film on the surface of said substrate, said method further comprising the steps of:
   introducing microwaves to said planar target placed under a predetermined pressure condition in a processing chamber, with a surface of said planar target being opposed to a surface of said substrate on which said thin film is to be sputtered, said microwaves being introduced from a direction along said surface of said target;
   maintaining said plasma in an area above the surface of said target, using the microwaves and magnetic fields defined with magnet means; and
   accelerating ions in said plasma toward and onto the surface of said target by the action of an electric field established by said electrode structure to cause impingement of the ions against the surface of said target thereby causing said sputtering of the target material from said target for deposition of the film on the surface of said substrate.

2. A sputtering method as claimed in claim 1, wherein said mirror magnetic field has magnetic lines of force of a configuration covering said target for trapping electrons in an area near said target.

3. A sputtering method as claimed in claim 1, wherein said step of maintaining said plasma includes disposing a pair of magnets outside of said electrode structure so as to produce a mirror magnetic field, said pair of magnets being said magnet means, and directing microwaves toward and into the space defined by said mirror magnetic field, thereby generating said plasma in said space.

4. A sputtering method as claimed in claim 3, wherein the magnetic lines of force of said mirror magnetic field do not substantially form a closed loop inside the electrode structure carrying said target.

5. A sputtering method as claimed in claim 3, wherein said space is defined in a plasma generating chamber disposed adjacent to the processing chamber containing said electrode structure and said substrate therein, and said step of maintaining said plasma includes guiding said plasma to migrate from said plasma generating chamber toward the area above said target in said processing chamber.

6. A sputtering method as claimed in claim 5, wherein said plasma generating chamber includes an opening toward a point above said target and communicating with a microwave source through a microwave-permeable window disposed between the pair of said magnets producing said mirror magnetic field.

7. A sputtering method as claimed in claim 6, wherein said mirror magnetic field has a strength greater than the value required for satisfying the condition of electron cyclotron resonance with the microwaves used, and its strength on the side of said window is larger than that on the side of said opening.

8. A sputtering method as claimed in claim 7, further comprising the step of generating a magnetic field along the surface of said target for accelerating migrating electrons toward said target and trapping the electrons in an area near said target.

9. A sputtering method as claimed in claim 7, wherein the axis of said plasma generating chamber is horizontal and lies above said target.

10. A sputtering method as claimed in claim 3, wherein said space is defined in the vicinity of the surface of said target, and said magnet pair for establishing the mirror magnet field are disposed around said processing chamber containing said electrode structure and said substrate therein.

11. In a method for sputtering including disposing an electrode structure carrying a planar target opposite to a substrate and causing sputtering of the target material from said planar target by the action of plasma for deposition of a thin film of the material of the target on the surface of said substrate, said method further comprising the steps of:
   introducing a gas for forming plasma;
   producing a mirror magnetic field in a second space which is outside of and adjoins a first space containing said electrode structure and said substrate disposed opposite to each other, said second space having its central axis extending toward an area above said target, the mirror magnetic field being produced using magnet means;
   directing microwaves toward the area above said target in a relation substantially coaxial with said mirror magnetic field, said microwaves being directed in a direction parallel to said target, the microwaves and magnet means acting together to produce the high-density plasma in said second space;
   causing migration of said high-density plasma toward the area above said target in said first space; and
   applying a voltage across said electrode structure to establish an electric field substantially perpendicular to the surface of said target for bringing ions in the migrated plasma into impingement against the surface of said target, thereby causing said sputtering of the target material from said target for deposition of the film on the surface of said substrate.

12. A sputtering method as claimed in claim 11, further comprising the step of generating a magnetic field above said target in a relation substantially parallel to the surface of said target and imparting rotary motion to the electrons.

13. A sputtering apparatus including an electrode structure carrying a target thereon, a substrate supporting structure supporting a substrate opposite to said target, and means for generating high-density plasma for causing sputtering of the target material from said target for deposition of a thin film on the surface of said substrate, said means for generating high-density plasma comprising:
   a pair of magnets disposed at a place remote from said electrode structure, said magnet pair establishing a mirror magnetic field defining a high-density plasma generating space; and
   a microwave source directing microwaves toward and into said high-density plasma generating space, said microwave source directing the microwaves parallel to the surface of the target and along the surface of the target, the mirror magnetic field and the microwave source acting in combination to provide the high-density plasma above the planar target over a wide surface area of the target.

14. A sputtering apparatus as claimed in claim 13, wherein said high-density plasma generating space is defined in an area near the surface of said target, and said magnet pair are spaced apart in the direction of the normal to the center of said target, in a relation coaxial with said normal.

15. A sputtering apparatus as claimed in claim 13, wherein said mirror magnetic field has a strength greater than that required for satisfying the condition of electron cyclotron resonance of said microwaves.

16. A sputtering apparatus as claimed in claim 15, wherein said high-density plasma generating space is defined at a place remote from said electrode structure, and said electrode pair and said microwave source are disposed around said high-density plasma generating space so that said mirror magnetic field is substantially coaxial with the microwaves.

17. A sputtering apparatus as claimed in claim 16, wherein said high-density plasma generating space is defined in a waveguide, and said waveguide has an opening toward said target.

18. A sputtering apparatus as claimed in claim 17, wherein said magnet pair are disposed along the longitudinal direction of said waveguide in coaxial relation with said waveguide, and said magnet remoter from said target than said magnet closer to said target generates a magnetic field having a strength greater than that of the latter.

19. A sputtering apparatus as claimed in claim 18, wherein said waveguide has its central axis extending substantially toward an area above said target.

20. A sputtering apparatus as claimed in claim 18, wherein said target is disposed in horizontal relation, and said waveguide is also disposed in horizontal relation with its upper end being lower than the surface of said substrate and its central axis being higher than the surface of said target.

21. A sputtering apparatus as claimed in claim 20, wherein said electrode structure includes a cathode disposed beneath said target and a pair of magnets disposed on the opposite two sides of said target, said magnet pair generating a magnetic field which is substantially parallel to the surface of said target and is so directed that electrons migrating through said waveguide are given rotary motion.

22. A sputtering apparatus assisted with microwave power source comprising:
  a cathode and a substrate holder, said cathode adapted to hold a planar target composed of a material that is to be sputtered, the substrate holder adapted to hold a substrate in a manner to be opposed to said target; and
  a plasma introducing window; a microwave power source; and magnet means, remote from the cathode, for generating a plasma in combination with said microwave power source, for sputtering said target, said magnet means being adapted to generate a magnetic field which transfers sideways said plasma into a space between said target and said substrate holder.

23. A sputtering apparatus as claimed in claim 22, wherein said microwave power source is adapted to provide microwaves in a direction parallel to the surface of the planar target.

24. A sputtering apparatus assisted with microwave power source comprising:
  a cathode and a substrate holder, said cathode being adapted to hold a planar target composed of a material that is to be sputtered, the substrate holder being adapted to hold a substrate in a manner to be opposed to said target;
  a microwave introducing window through which microwave power is introduced into space between said target and said substrate holder; and
  magnet means positioned outside and surrounding a chamber having said cathode and said substrate holder enclosed therein, which magnet means generates a magnetic field; which magnet means, in combination with said microwave power source, generates said plasma; and which magnet means confines the plasma adjacent said target surface.

* * * * *